(12) United States Patent
Thomas, III et al.

(10) Patent No.: US 6,566,693 B1
(45) Date of Patent: May 20, 2003

(54) REDUCED CAPACITANCE SCALED HBT USING A SEPARATE BASE POST LAYER

(75) Inventors: Stephen Thomas, III, West Los Angeles, CA (US); Charles Fields, Malibu, CA (US)

(73) Assignee: HRL Laboratories, LLC, Malibu, CA (US)

(*) Notice: Subject to any disclaimer, the term of this patent is extended or adjusted under 35 U.S.C. 154(b) by 7 days.

(21) Appl. No.: 09/665,340

(22) Filed: Sep. 19, 2000

(51) Int. Cl.⁷ .......................................... H01L 31/0328
(52) U.S. Cl. ...................... 257/197; 438/312; 438/320
(58) Field of Search ................................ 257/197, 198; 438/312, 318, 319, 320

(56) References Cited

U.S. PATENT DOCUMENTS 5,729,033 A * 3/1998 Hafazi ........................ 257/198
5,994,194 A   11/1999 Lammert

OTHER PUBLICATIONS

M. Sokolich et al.., "A Low Power 52.9 GHz Static Divider Implemented in a Manufacturable 180 GHz AlInAs/InGaAs HBT IC Technology", GaAs IC Symposium Technical Digest, pp. 117–120, 1998.

A. Gutierrez–Aitken et al., "69 GHz Frequency Divider with a Cantilevered Base InP DHBT", IEDM Technical Digest, 1999.

Sokolich, M., et al. "A low power 52.9 GHz static divider implemented in a manufacturable 180 GHz AlInAs HBT IC technology" Gallium Arsenide Integrated Circuit (GAAS IC) Symposium, 1998, Technical Digest 1998, NY, USA, IEEE, US Nov. 1, 1998, pp. 117–120, XP010309899.

Park, S. H., et al. "Submicron Self–Aligned HBT's by Selective Emitter Regrowth" IEEE Electron Device Letters, IEEE Inc. New York, US, vol. 19, No. 4, Apr. 1, 1998, pp. 118–120, XP000738793.

Lester, T., et al. "A Manufactura Process for HBT Circuits" Gallium Arsenide and Related Compounds, Freiburg, Aug. 29–Sep. 2, 1993, Proceedings of the International Symposium on Gallium Arsenide and Related Compounds, vol. SYMP 20, pp. 449–454, XP000478977.

* cited by examiner

Primary Examiner—Sara Crane
(74) Attorney, Agent, or Firm—Tope-McKay & Associates

(57) ABSTRACT

High-speed, low capacitance heterojunction bipolar transistors (HBTs) and a method for their fabrication are disclosed. The devices are fabricated by a manufacturable process which moves patterning and deposition of the base post up versus the current manufacturing process, thus permitting fabrication of a smaller base post and base metal contact and reducing the base-collector capacitance.

16 Claims, 5 Drawing Sheets

REDUCED CAPACITANCE SCALED HBT USING A SEPARATE BASE POST LAYER

FIELD OF THE INVENTION

The present invention relates to heterojunction bipolar transistors (HBTs), integrated circuits utilizing HBTs (HBT-ICs) and methods for their fabrication.

BACKGROUND OF THE INVENTION

High-speed, complex circuitry is essential to many electronic and communications applications, including fiber optical communications, frequency synthesizers, and analog-digital conversion. Heterojunction bipolar transistors (HBTs) are preferred technology for achieving the necessary levels of both complexity and speed required by these applications.

Presently, high-speed InP HBTs are manufactured using I-line optical lithography to define as small a base-collector area on the HBT as possible. [M. Sokolich et al., GaAs IC Symposium Technical Digest, pp. 117–120, 1998]. Using this process, a 52.9 GHz static divider has been developed. In this method, the base and collector posts are patterned after the mesa has been completely etched. The height of the mesa requires that a certain photoresist thickness be used to cover the mesa. The thickness requirement limits the minimum dimensions that can be resolved by the optical lithography equipment. As a result, the base post is necessarily larger than if it were defined earlier in the process, which accordingly places a minimum limit on the base-collector area and corresponding capacitance of the HBT.

Approaches to further improving the speed of present HBTs have been reported. [Gutierrez-Aitken, A., et al., IEDM Tech. Digest, 1999; Lee, Q., et al., IEEE GaAs IC Symposium Tech. Dig., pp. 87–90, 1999]. One process for preparing faster HBTs utilizes patterned substrates and e-beam lithography. [Lee, Q., et al., IEEE GaAs IC Symposium Tech. Dig., pp. 87–90, 1999]. This process has advantages for being able to define very small features; however, it is not adaptable to manufacturing.

Yet another process relies on severe undercutting of the base metal to define a small base-collector area. [Gutierrez-Aitken, A., et al., IEDM Tech. Digest. 1999] Using this process, a 69 GHz divider was prepared. However, this process would also seem to have manufacturing and reliability concerns.

SUMMARY OF THE INVENTION

The present invention provides high-speed HBTs and a process for their fabrication that is adaptable to manufacturing and provides for faster circuit speeds than previous processes. The fabrication process of the present invention, separates the definition of the base and collector posts while maintaining the number of mask levels. Unlike the current manufacturing process referred to above and described herein, the process of the present invention allows the base post to be patterned earlier in the process prior to etching of the base. This is important because thinner photoresist can thus be used to pattern the base post. As a result, the base post is patterned on a more planar surface, thereby reducing the minimum resolvable feature size below (600 nm)$^2$. The smaller base post allows reduction of the base metal contact area and the base-collector capacitance, which directly affects the speed of the resulting device.

DETAILED DESCRIPTION OF THE INVENTION

Figure 1:
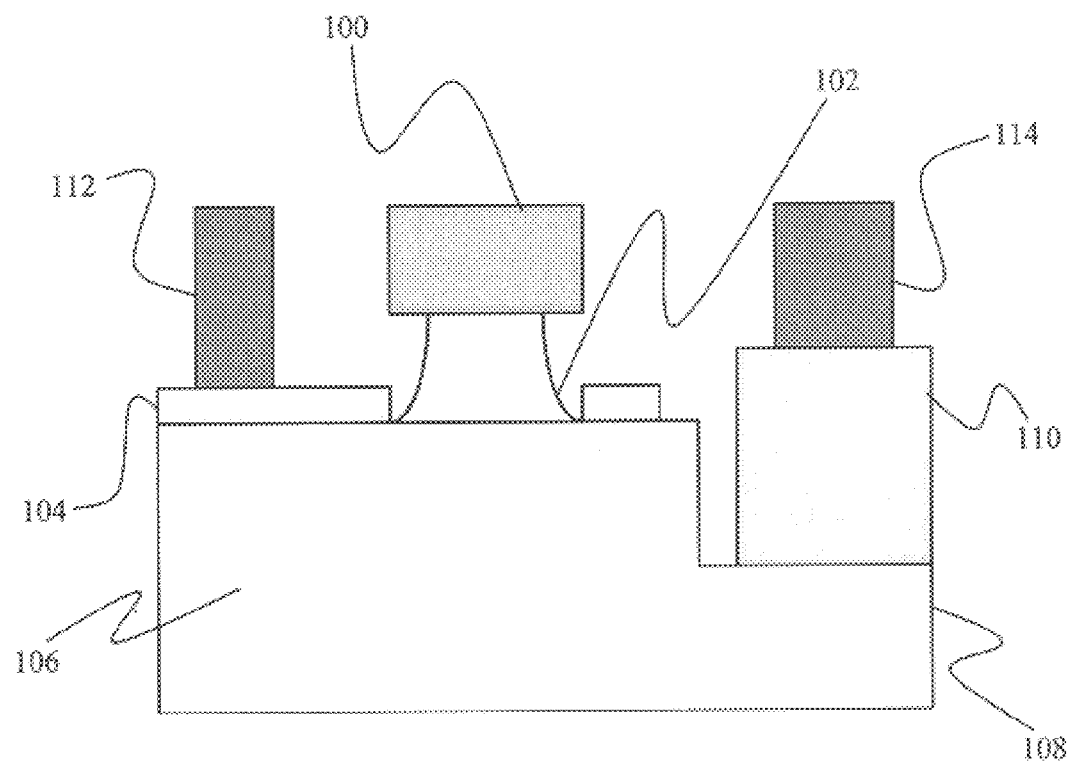
FIG. 1 depicts a side view of a typical HBT according to the present invention.
Figure 2:
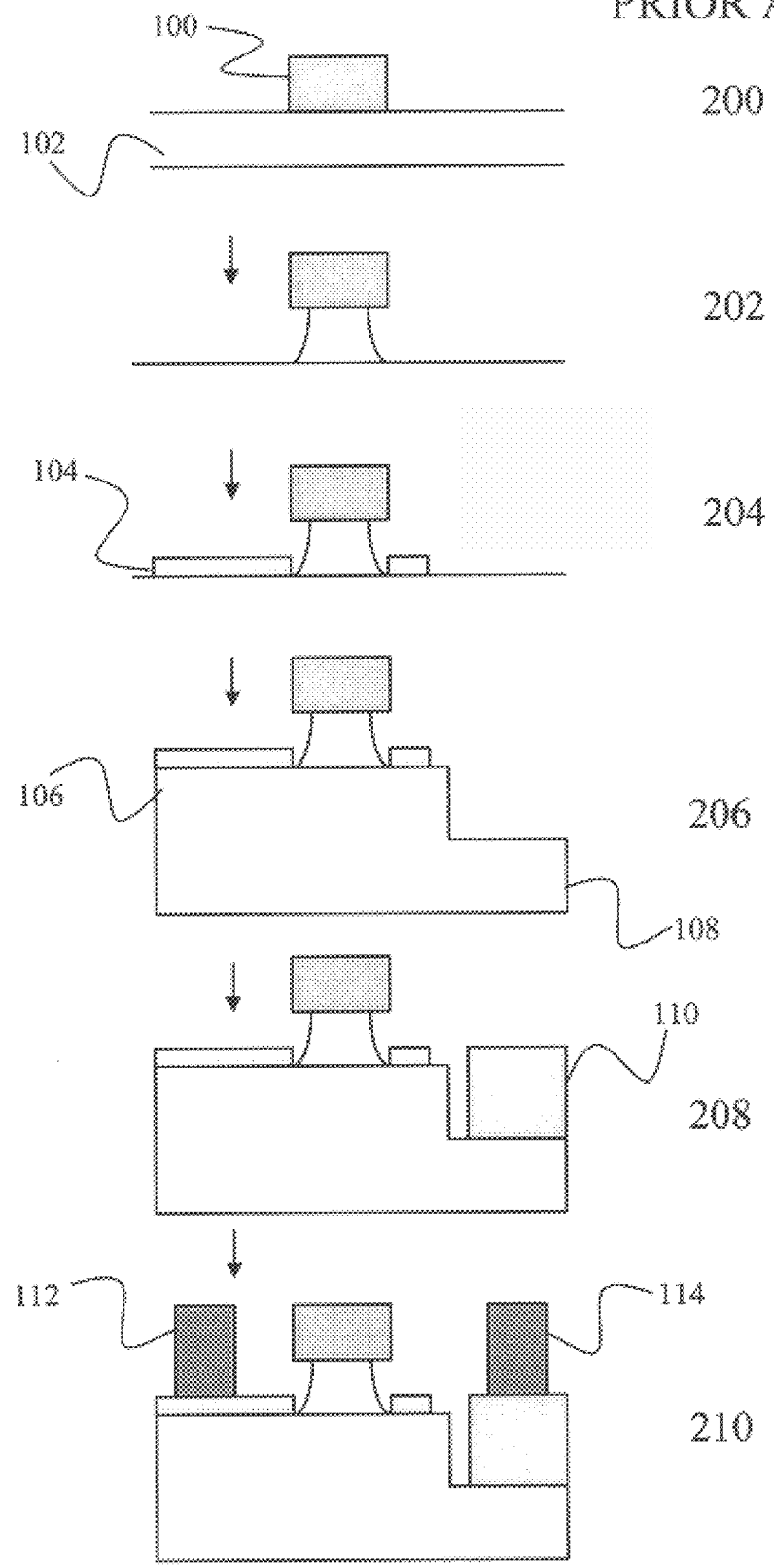
FIG. 2 provides a flow chart of the conventional manufacturing process for InP HBTs.

The process of the present invention for preparing an improved HBT device as shown in FIG. 1 utilizes currently conventional procedures for the initial development of the design of the device. While the processes described herein have primarily been applied to HBTs and HBT-IC's based on In-P (indium phosphide), it should be apparent to one skilled in the art that the present invention applies generally to HBTs and circuits containing these transistors. The current process for manufacturing In-P HBTs is depicted in FIG. 2, and the modified process of the present invention is outlined in FIG. 3. To begin the fabrication in both the present manufacturing process and the improved process of the present invention, the emitter metal contact 100 is patterned and deposited on to the emitter 102 as shown in 200 and 300. Next, the emitter 102 is etched as shown in 202 and 302, and a self-aligned base metal contact 104 is deposited as shown in 204 and 304.

In the conventional manufacturing process, the base-collector mesa 106 is patterned and etched, and then the sub-collector mesa 108 is patterned and etched as shown in 206. Then the collector metal contact 110 is deposited on to the sub-collector mesa as depicted in 208. However, the present invention modifies this sequence of steps. In a preferred embodiment of the present invention, after the self-aligned base metal contact 104 is deposited, the base post 112 is patterned and deposited as shown in 306, followed by patterning and etching of the base-collector mesa 106 and sub-collector mesa 108 as shown in 308 and deposition of the collector metal contact 110 as shown in 310. The final step of the conventional manufacturing process involves adding the base post 112 and the collector post 114; whereas in the present invention, only the collector post 114 remains to be deposited.

Moving the definition of the base post 112 up in the fabrication, process permits the use of thinner photoresist to pattern the base post 112 compared to the present manufacturing process. Reducing the photoresist thickness provides a more planar surface for patterning the base post 112, and thus the minimum resolvable feature size can also be decreased. Because the resultant base post 112 is smaller, the base-collector mesa 106 area and, accordingly. the base-collector capacitance are correspondingly reduced. The base-collector capacitance is a primary determinant of the device's maximum frequency of oscillation (Fmax), and directly affects the ultimate speed of divider circuits used to assess the technology's potential for high-speed operation.

Figure 3:
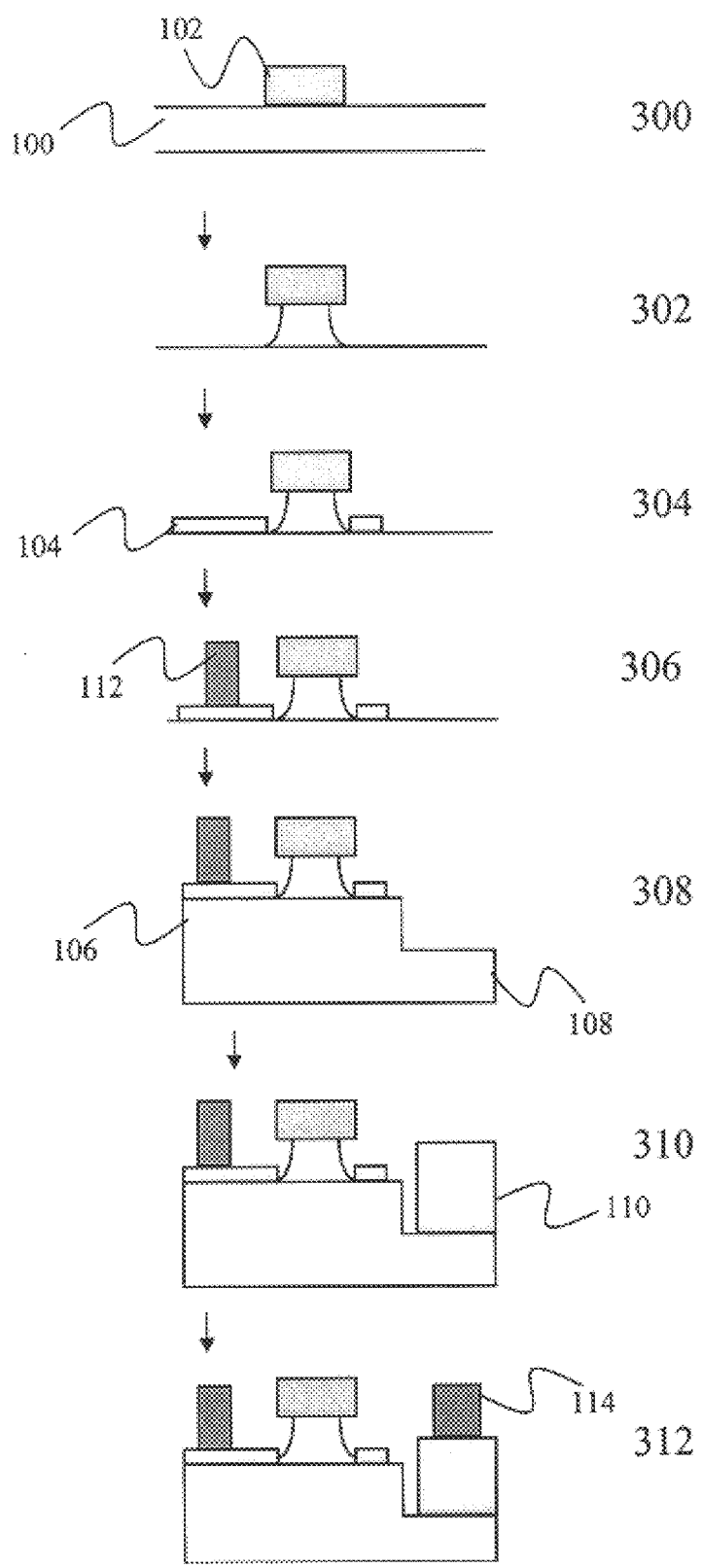
FIG. 3 provides a flow chart of the improved fabrication process for HBTs according to the present invention.

In the current manufacturing process, the collector metal contact 110 is deposited to match the height of the self-aligning base metal contact 104 so that the base post 112 and collector post 114 will be at the same level after planarization. In the current embodiment of the present invention, the collector metal contact height need not be set to match the base layer. As shown in FIG. 3, the collector post 114 is deposited on the collector metal contact 110 independently of the base post 112. This provides increased flexibility compared to the current manufacturing process. In an alternate embodiment of the present invention, a collector via etched through an insulating film to the collector metal contact 110 is utilized as the contact to the collector metal contact 110 in place of a collector post 114.

Figure 4:
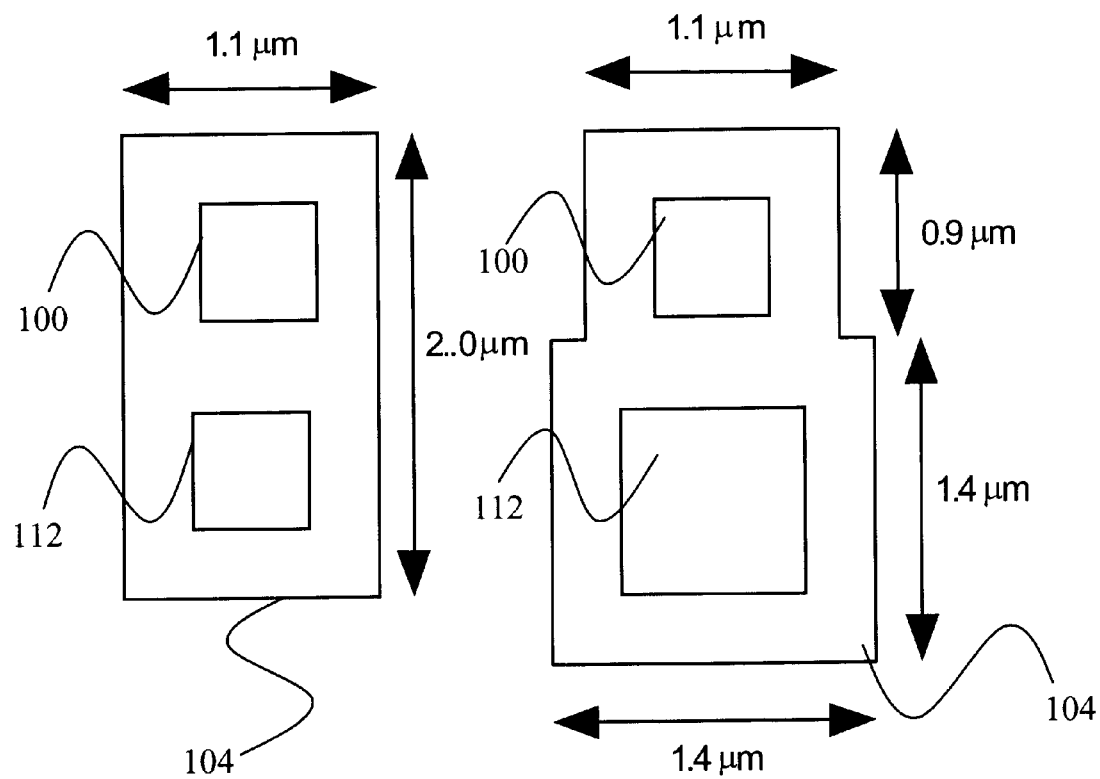
FIG. 4 provides a top view comparison of an HBT prepared by the conventional process (FIG. 4a) and an HBT according to the present invention (FIG. 4b).
Figure 5:
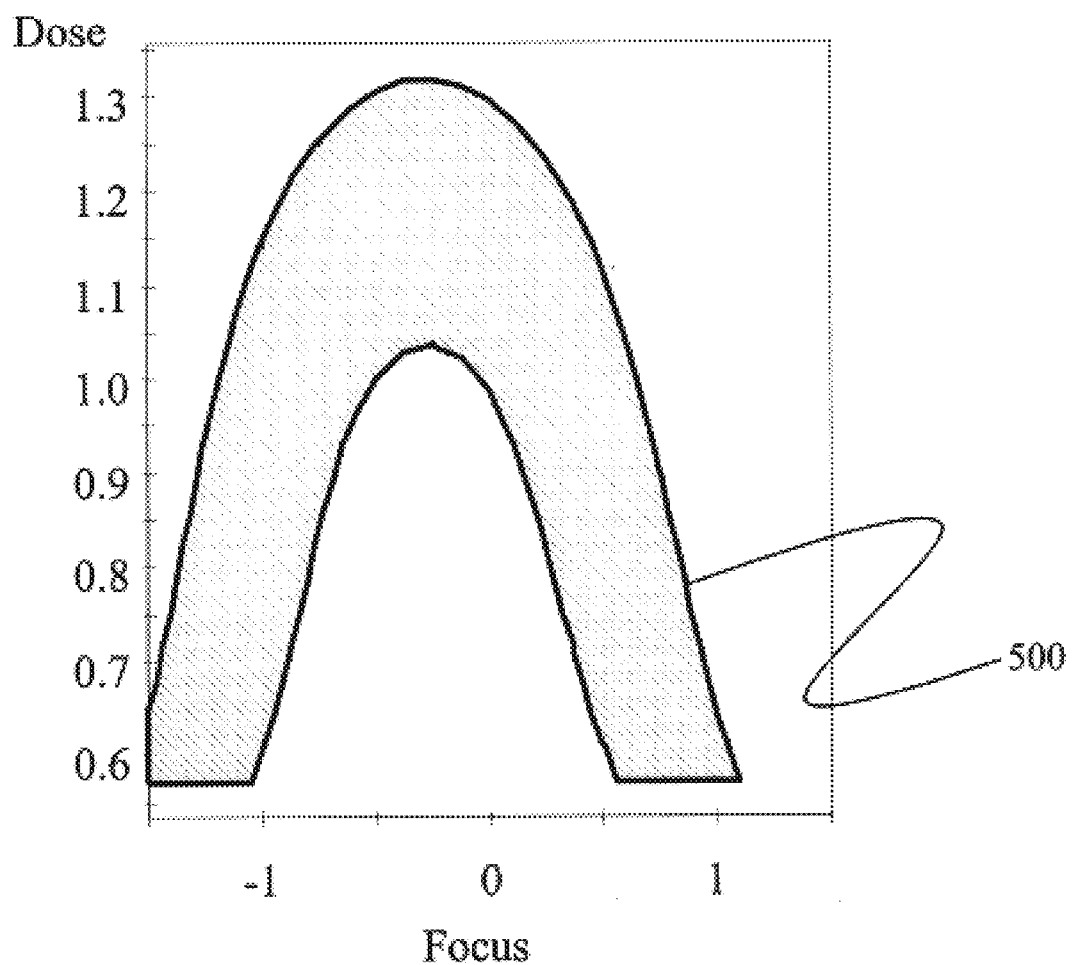
FIG. 5 depicts the process window for 500 nm×500 nm features utilizing the fabrication method of the present invention.

The improved resolution of features on HBT devices according to the present invention is illustrated in FIG. 4. This figure compares the layout of In-P HBTs prepared using the conventional process, as shown in FIG. 4a, and the improved process of the present invention, as shown in FIG. 4b. The HBTs were initially prepared with $(500 \text{ nm})^2$ emitters. For the conventional process, 2 µm thick photoresist was required to fabricate the HBT. At this thickness level, a $(600 \text{ nm})^2$ base post 112 was not resolvable. However, in the improved process, only 1 µm of photoresist was required, and a $(500 \text{ nm})^2$ base post 112 could be resolved. By moving the base post definition up in the fabrication process, it was possible to reduce the self-aligning base metal area of the HBT from 3.0 to 2.2 $\mu m^2$. FIG. 5 depicts the process window (shaded area) for obtaining $(500 \text{ nm})^2$ features by I-beam lithography using 1 µm of photoresist.

Thus, devices according to the present invention have reduced base-collector capacitance and, accordingly, are capable of higher speeds than previously disclosed HBTs. Preferred embodiments of the present invention include In-P HBTs prepared according to the improved process of the present invention. Other preferred embodiments include HBTs of the "III–V" type such as, but not limited to, those grown on InP substrates, for example, InP/InGaAs or AlInAs/InGaAs/InP, and those grown on GaAs substrates, for example, GaAs/AlGaAs or GaAs/InGaP. Those skilled in the art will recognize that HBTs according to the present invention can be incorporated into integrated circuits for use in a broad range of applications, particularly communications-based applications.

What is claimed is:

1. A method for fabricating a heterojunction bipolar transistor (HBT), wherein the HBT comprises an emitter, a collector and a base, wherein the collector and the base form a base-collector mesa, and the HBT further comprises a sub-collector mesa, an emitter metal contact, a self-aligning base metal contact, a base post, a collector metal contact, and a collector post or via, wherein the base is positioned between the emitter and the collector and, accordingly, the base-collector mesa is sandwiched between the emitter and the sub-collector mesa, and the method comprises the steps of:
   a. patterning the emitter metal contact;
   b. depositing the emitter metal contact on the emitter, incompletely covering the emitter;
   c. etching the emitter not covered by the emitter metal contact to expose the base;
   d. patterning the self-aligned base metal contact;
   e. depositing the self-aligned base metal contact on the base and emitter metal contact, incompletely covering the base;
   f. patterning the base post;
   g. depositing the base post on the self-aligned base metal contact;
   h. patterning the base collector-mesa on the base not covered by the self-aligning base metal contact;
   i. etching the base not covered by the self-aligned base metal contact to fabricate the base-collector mesa and define and incompletely expose the sub-collector mesa;
   j. patterning the collector metal contact;
   k. depositing the collector metal contact on the sub-collector mesa exposed by fabricating the base-collector mesa;
   l. patterning the collector post or via, and
   m. depositing the collector post on the collector metal contact or etching a collector via through a subsequent insulating film to the collector metal contact.

2. A method for fabricating an HBT as set forth in claim 1, wherein the base post has a top surface area and the top surface area is less than or equal to $(600 \text{ nm})^2$.

3. A method for fabricating an HBT as set forth in claim 1, wherein the base post has a top surface area and the top surface area is less than or equal to $(500 \text{ nm})^2$.

4. A method for fabricating an HBT as set forth in claim 1, wherein a "III–V" substrate is used to grow the emitter, the collector, and the base.

5. A method for fabricating an HBT as set forth in claim 1, wherein an indium phosphide (InP) substrate is used to generate the emitter, the collector, and the base.

6. A method for fabricating an HBT as set forth in claim 1, wherein the HBT is incorporated into an integrated circuit.

7. A heterojunction bipolar transistor (HBT), comprising an emitter, a base and a collector, wherein the base and collector together form a base-collector mesa, and further comprising a sub-collector mesa, an emitter metal contact, a self-aligned base metal contact, a base post, a collector metal contact, and a collector post or via, wherein the base is positioned between the emitter and the collector and, accordingly, the base-collector mesa is sandwiched between the emitter and the sub-collector mesa, and wherein the base post has a top surface area and the top surface area is less than or equal to $(600 \text{ nm})^2$.

8. An HBT as set forth in claim 7, wherein the surface area of the base post is less than or equal to $(500 \text{ nm})^2$.

9. An HBT as set forth in claim 7, wherein a "III-V" substrate was used to grow the emitter, the collector, and the base.

10. An HBT as set forth in claim 7, wherein an indium phosphide (InP) substrate was used to grow the emitter, the collector, and the base.

11. An HBT as set forth in claim 7, wherein the HBT is included in an integrated circuit.

12. A heterojunction bipolar transistor (HBT), comprising an emitter, a base and a collector, wherein the base and collector together form a base-collector mesa, and further comprising a sub-collector mesa, an emitter metal contact, a self-aligned base metal contact, a base post, a collector metal contact, and a collector post or via, wherein the base is positioned between the emitter and the collector and, accordingly, the base-collector mesa is sandwiched between the emitter and the sub-collector mesa, and the HBT is fabricated by a method comprising the steps of:
   a. patterning the emitter metal contact;
   b. depositing the emitter metal contact on the emitter, incompletely covering the emitter;
   c. etching the emitter not covered by the emitter metal contact to expose the base;
   d. patterning the self-aligned base metal contact;
   e. depositing the self-aligned base metal contact on the base and emitter metal contact, incompletely covering the base;
   f. patterning the base post;
   g. depositing the base post on the self-aligned base metal contact;

h. patterning the base collector-mesa on the base not covered by the self-aligning base metal contact;

i. etching the base not covered by the self-aligned base metal contact to fabricate the base-collector mesa and define and incompletely expose the sub-collector mesa;

j. patterning the collector metal contact;

k. depositing the collector metal contact on the sub-collector mesa exposed by fabricating the base-collector mesa;

l. patterning the collector post or via, and m. depositing the collector post on the collector metal contact or etching a collector via through a subsequent insulating film to the collector metal.

13. An HBT as set forth in claim 12, wherein the base post has a top surface area and the top surface area is less than $(600 \text{ nm})^2$.

14. An HBT as set forth in claim 12, wherein the base post has a top surface area and the top surface area is less than $(500 \text{ nm})^2$.

15. An HBT as set forth in claim 12, wherein a "III-V" substrate was used to grow the emitter, the collector, and the base.

16. An HBT as set forth in claim 12, wherein an indium phosphide (InP) substrate was used to grow the emitter, the collector, and the base.

* * * * *